United States Patent [19]
Bae

[11] Patent Number: 6,015,650
[45] Date of Patent: *Jan. 18, 2000

[54] METHOD FOR FORMING MICRO PATTERNS OF SEMICONDUCTOR DEVICES

[75] Inventor: Sang Man Bae, Ichon, Rep. of Korea

[73] Assignee: Hyundai Electronics Industries Co., Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/777,202

[22] Filed: Dec. 27, 1996

[30] Foreign Application Priority Data

Dec. 29, 1995 [KR] Rep. of Korea ................ 95-66023

[51] Int. Cl.⁷ .......................................... G03F 7/00
[52] U.S. Cl. .................... 430/314; 430/330; 430/394
[58] Field of Search ................... 430/312, 314, 430/318, 329, 330, 394, 313; 438/720

[56] References Cited

U.S. PATENT DOCUMENTS

| | | | |
|---|---|---|---|
| 4,253,888 | 3/1981 | Kikuchi | 430/330 |
| 4,820,611 | 4/1989 | Arnold, III et al. | 430/313 |
| 5,093,224 | 3/1992 | Hashimoto et al. | |
| 5,126,231 | 6/1992 | Levy | 430/313 |
| 5,139,904 | 8/1992 | Auda et al. | 430/313 |
| 5,229,257 | 7/1993 | Cronin | 430/315 |
| 5,476,753 | 12/1995 | Hashimoto et al. | |
| 5,494,839 | 2/1996 | Hong et al. | 438/253 |
| 5,686,223 | 11/1997 | Cleeves | 430/312 |
| 5,705,319 | 1/1998 | Bae et al. | 430/312 |

Primary Examiner—Kathleen Duda
Attorney, Agent, or Firm—Thelen Reid & Priest, LLP

[57] ABSTRACT

A method for forming micro patterns of a semiconductor device which is capable of forming, on a semiconductor substrate, accurate micro patterns having a dimension smaller than the resolution of a stepper as used. The method includes the steps of providing a semiconductor substrate, forming an low layer over the semiconductor substrate, forming a first photosensitive film over the low layer, selectively removing the first photosensitive film by use of a first light exposure mask, thereby forming a first photosensitive film pattern, forming an intermediate layer over the entire exposed upper surface of the resulting structure obtained after the formation of the first photosensitive film pattern, forming a second photosensitive film over the intermediate layer, selectively removing the second photosensitive film by use of a second light exposure mask, thereby forming a second photosensitive film pattern having pattern portions each being disposed between adjacent pattern portions of the first photosensitive film pattern, selectively removing the intermediate layer by use of the second photosensitive film pattern in such a manner that the first photosensitive film pattern is exposed; and selectively removing the low layer while using the first and second photosensitive film patterns are used as a mask, thereby forming an low layer pattern.

6 Claims, 3 Drawing Sheets

METHOD FOR FORMING MICRO PATTERNS OF SEMICONDUCTOR DEVICES

BACKGROUND OF THE INVENTION

1. Field of the Invention

The present invention relates to a method for fabricating semiconductor devices, and more particularly to a method for forming micro patterns of semiconductor devices which is proper for the fabrication of a highly integrated semiconductor device.

2. Description of the Prior Art

Recently developed semiconductor devices have an increased integration degree so that they are able to contain a large number of circuits, thereby being capable of processing and storing an increased quantity of information. The integration of such semiconductor devices depends on the accuracy in forming circuits and lines connecting those circuits together within a limited region. In order to accurately form such circuits and connecting lines, it is necessary to form photoresist film patterns having a micro dimension. Such photoresist film patterns are used as etch barriers upon conducting an etch process required to form circuits and connecting lines.

Typically, the formation of such photoresist film patterns involves coating with a photoresist film, light exposure and development. The light exposure process is carried out using a photolithograpy device or stepper which serves to irradiate light onto the surface of the photoresist film in such a manner that the photoresist film is selectively exposed to the irradiated light by a light exposure mask. The stepper serves as an important factor for defining micro patterns having a micro dimension. The ability of such a stepper to form a micro pattern is called "a resolution". The resolution R of a stepper can be expressed by the following equation:

$$R = k \times \lambda / NA$$

where, k represents a process constant, $\lambda$ represents the wavelength of light emitted from a light source, and NA (numerical aperture) represents a constant relating to the diameter of the aperture of light passing through a lens equipped in the stepper.

However, the above-mentioned parameters, namely, the wavelength of light, the diameter of the aperture of the lens, and the process constant, can not be controlled below certain limits respectively associated therewith. For example, steppers using light sources such as G-line, i-line and excimer lasers respectively having wavelengths of 436, 365 and 248 nm are limited in that they have light resolutions capable of forming patterns with dimensions of about 0.7, 0.5 and 0.3 $\mu$m, respectively.

Meanwhile, the light exposure mask should be provided with light shield patterns which are formed on a transparent substrate in such a manner that they have a space width larger than the light resolution of the stepper as used. This is because when the light shield patterns have a space width smaller than the light resolution of the stepper, the surface of the photoresist film may be exposed to light in a wider region than desired, due to the diffraction of light.

For this reason, the above-mentioned conventional methods of forming micro patterns are problematic in that they can not form micro patterns having a dimension of 0.3 $\mu$m or less. This results in difficulty in developing semiconductor devices of 1 Giga DRAM or more.

SUMMARY OF THE INVENTION

Therefore, an object of the invention is to provide a method for forming micro patterns of a semiconductor device which is capable of forming accurate micro patterns having a dimension smaller than the resolution of a stepper as used.

Another object of the invention is to provide a method for forming micro patterns of a semiconductor device which is capable of improving the integration degree of the semiconductor device.

In accordance with one aspect of the present invention, a method for forming a micro pattern of a semiconductor device comprises the steps of: providing a semiconductor substrate, forming an low layer over the semiconductor substrate; forming a first photosensitive film over the low layer; selectively removing the first photosensitive film by use of a first light exposure mask, thereby forming a first photosensitive film pattern; forming an intermediate layer over the entire exposed upper surface of the resulting structure obtained after the formation of the first photosensitive film pattern; forming a second photosensitive film over the intermediate layer; selectively removing the second photosensitive film by use of a second light exposure mask, thereby forming a second photosensitive film pattern having pattern portions each being disposed between adjacent pattern portions of the first photosensitive film pattern; selectively removing the intermediate layer by use of the second photosensitive film pattern in such a manner that the first photosensitive film pattern, is exposed; and selectively removing the low layer while using the first and second photosensitive film patterns are used as a mask, thereby forming an low layer pattern.

In accordance with another aspect of the present invention, a method for forming a micro pattern of a semiconductor device comprises the steps of: providing a semiconductor substrate; sequentially forming an low layer, a first intermediate layer and a first photosensitive film over the semiconductor substrate; selectively removing the first photosensitive film by use of a first light exposure mask, thereby forming a first photosensitive film pattern; forming a second intermediate layer over the entire exposed upper surface of the resulting structure obtained after the formation of the first photosensitive film pattern; forming a second photosensitive film over the second intermediate layer; selectively removing the second photosensitive film by use of a second light exposure mask, thereby forming a second photosensitive film pattern having pattern portions each being disposed between adjacent pattern portions of the first photosensitive film pattern; selectively removing the second intermediate layer by use of the second photosensitive film pattern in such a manner that the first photosensitive film pattern is exposed; selectively removing both the first intermediate layer and the low layer while using the first and second photosensitive film patterns are used as a mask, thereby forming a first-intermediate layer pattern and an low layer pattern; and completely removing residual patterns left on the low layer pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 8 illustrate sequential steps of a method for forming micro patterns of a semiconductor device in accordance with an embodiment of the present invention.

Figure 1:
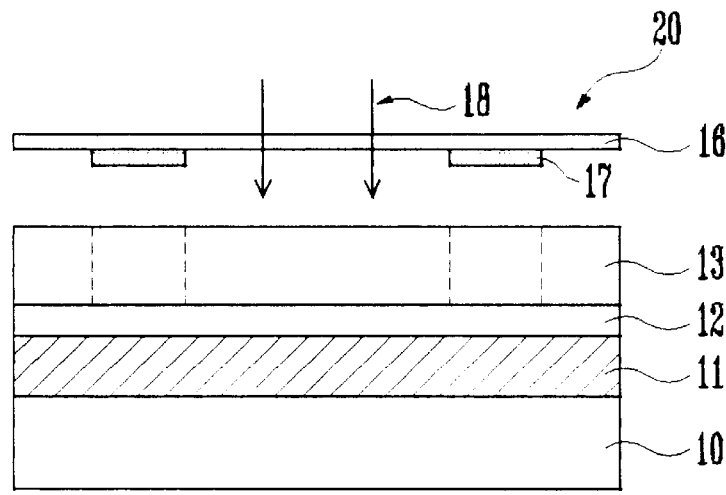
FIGS. 1 to 8 are sectional views respectively illustrating sequential steps of a method for forming micro patterns of a semiconductor device in accordance with an embodiment of the present invention.
Figure 2:
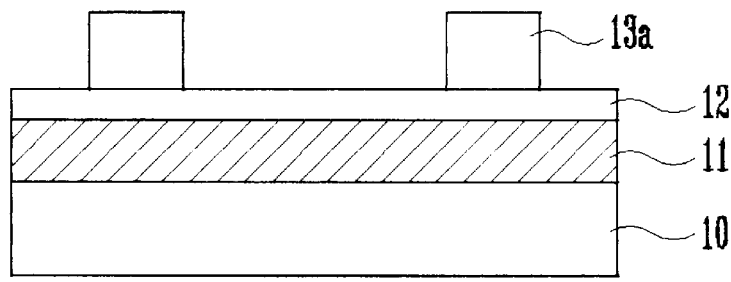
Figure 3:
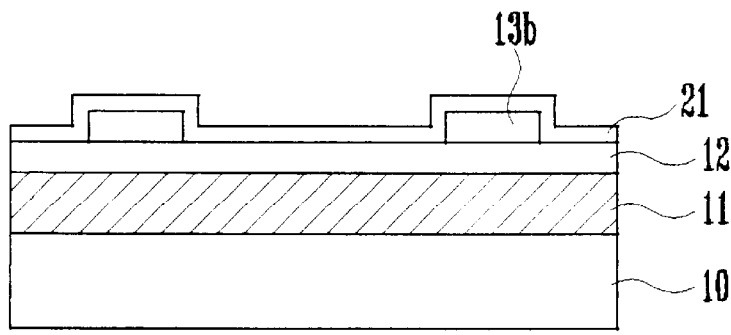

In accordance with this method, a semiconductor substrate 10 is first prepared, as shown in FIG. 1. A first thin film 11 and a second thin film 12 are sequentially formed over the semiconductor substrate 10. The semiconductor substrate 10 is made of silicon. The formation of the first thin film 11 is achieved by depositing a metal material over the semiconductor substrate 10. The first thin film 11 is used to form a desired pattern. On the other hand, the second thin film 12 serves as an intermediate layer and is formed by depositing a metal material over the first thin film 11.

Thereafter, a first photoresist film 13 is coated over the second thin film 12. A photosensitive material can be used instead of the first photoresist film 13. A first light exposure mask 20 is then prepared to selectively expose the first photoresist film 13 to light. The first light exposure mask 20 consists of a first transparent substrate 16 made of quartz and a first light shield film pattern 17 formed on the lower surface of the first transparent substrate 16. The first light shield film pattern 22 is made of chromium.

The first photoresist film 13 is then selectively exposed to light by irradiating light beams 18 onto the first photoresist film 13 through the first light exposure mask 20.

Thereafter, the first photoresist film 13, which has been selectively exposed to light, is developed and etched at its light-exposed portion, thereby forming a first photoresist film pattern 13a. The first photoresist film pattern 13a is then thermally annealed at a high temperature ranging from about 300° C. to 400° C. for about 0.5 to 1 minute. The annealing step is preferably carried out at a temperature of about 350° C. Alternatively, the first photoresist film pattern 13a may be thermally annealed at a temperature of about 80 to 120° C. for about 0.5 minutes or at a temperature of about 200 to 240° C. for about 0.5 to 1 minute. By this annealing, the first photoresist film pattern 13a is baked. The annealing step is preferably carried out at about 100° C. for about 0.5 minutes or at about 220° C. for about 1 minute.

By the annealing at a high temperature or baking at a lower temperature, the first photoresist film pattern 13a is changed to a baked photoresist film pattern 13b having a smaller thickness than that of the first photoresist film pattern 13a.

A plasma enhanced oxide film (hereinafter, referred to as "a PE-oxide film") 21 is then formed over the entire exposed upper surface of the resulting structure. The PE-oxide film 21 has a thickness of about 100 to 1,500 Å. The PE-oxide film 21 serves to allow a photoresist film (not shown), which is formed at a subsequent processing step, to have a uniform surface. The PE-oxide film 21 also serves to transfer a sufficient quantity of light to the photoresist film when the photoresist film is exposed to light. Such an effect is obtained as the PE-oxide film 21 prevents the baked photoresist film pattern 13b from absorbing light.

The PE-oxide film 21 also serves to completely remove a second photoresist film (not shown) in a region where light is irradiated, thereby stably keeping the remaining second photoresist film without involving a variation in pattern width upon etching the second thin film 12 and first thin film 11.

The same effect may be obtained when a tungsten-silicon (WSi) film or titanium alloy (for example, TiN) film is used instead of the PE-oxide film 21.

Figure 4:
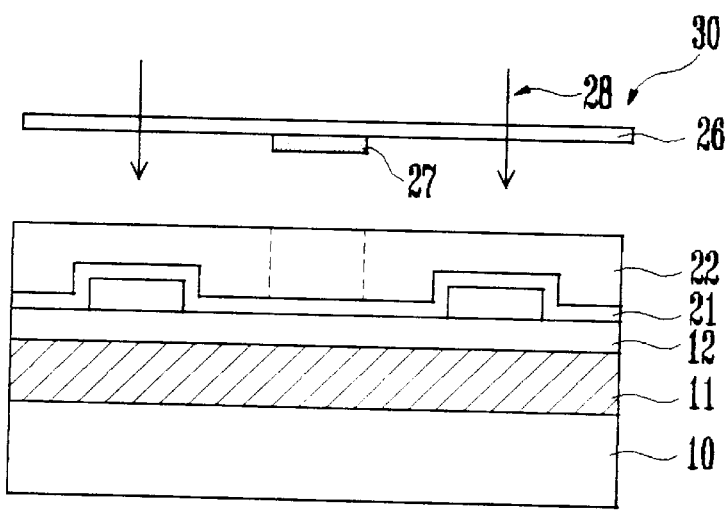

A second photoresist film 22 is then coated over the PE-oxide film 21 to have a uniform upper surface, as shown in FIG. 4. A photosensitive material can be used instead of the second photoresist film 22.

A second light exposure mask 30 is then prepared to selectively expose the second photoresist film 22 to light. The second light exposure mask 30 consists of a second transparent substrate 26 made of quartz and a second light shield film pattern 27 formed on the lower surface of the second transparent substrate 26. The second light shield film pattern 27 is made of chromium.

The second light shield film pattern 27 has line pattern portions each disposed between adjacent line pattern portions of the first light shield film pattern 17. That is, the second light shield film pattern 27 does not overlap with the first light shield film pattern 17. This means that both the first and second photoresist film patterns 17 and 27 have a space width larger than the wavelength of light beams by a large distance. Accordingly, it is possible to prevent the generation of a diffraction phenomenon of light beams.

Thereafter, the second photoresist film 22 is then selectively exposed to light by irradiating light beams 28 onto the second photoresist film 22 through the second light exposure mask 30.

Figure 5:
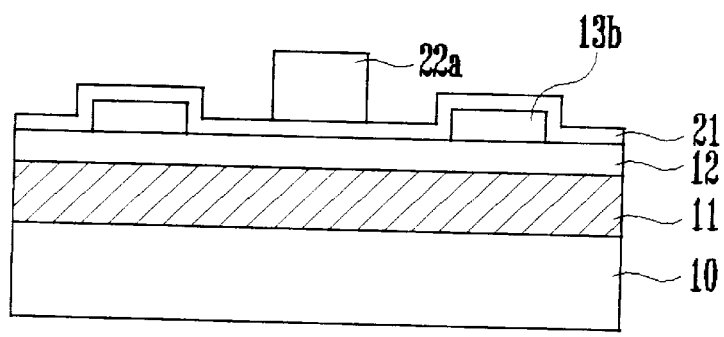

Thereafter, the light-exposed portion of the second photoresist film 22 is developed and etched, thereby forming a second photoresist film pattern 22a, as shown in FIG. 5. The second photoresist film pattern 22a has line pattern portions each disposed between adjacent line pattern portions of the baked photoresist film pattern 13b. The PE-oxide film 21 is selectively exposed at its portion not covered with the second photoresist film pattern 22a.

Figure 6:
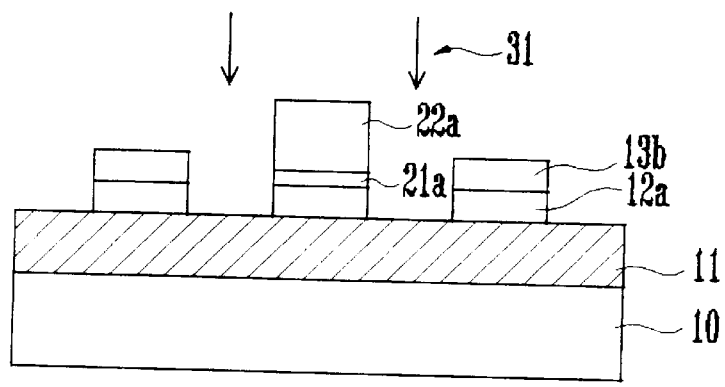

The exposed portions of the PE-oxide film 21 not covered with the second photoresist film pattern 22a are removed in accordance with a dry etch process using plasma gas 31, thereby forming a PE-oxide film pattern 21a as shown in FIG. 6. At this time, the second thin film 12 is partially exposed at its portions not covered with the second photoresist film pattern 22a and baked photoresist film pattern 13b.

Using the second photoresist film pattern 22a and baked photoresist film pattern 13b as a mask, the exposed portions of the second thin film 12 are then removed in accordance with the dry etch process using the plasma gas 31, thereby forming a second-thin film pattern 12a.

The second thin film pattern 12a is exposed on the lower surface of the baked photoresist film 13b and the PE-oxide film pattern 12a. The first thin film 11 is selectively exposed.

Figure 7:
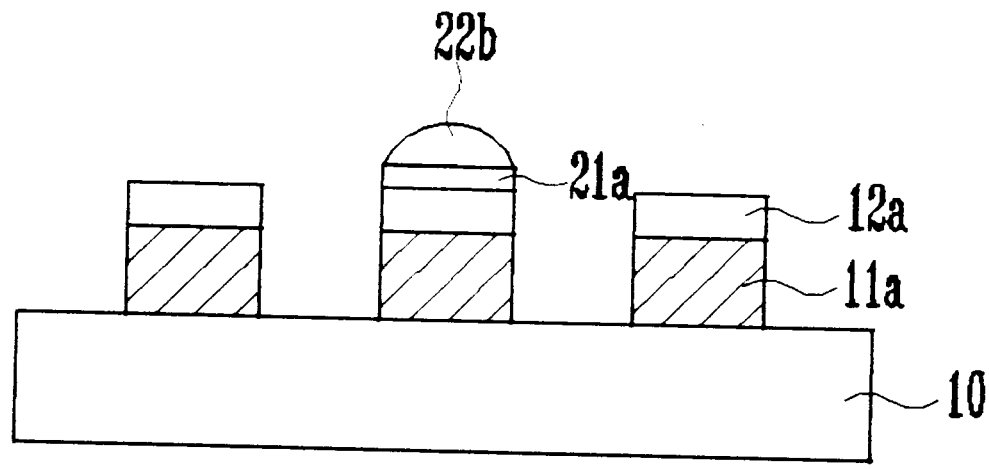

Subsequently, exposed portions of the first thin film 11 are removed in accordance with the dry etch process using plasma gas under the condition in which the second photoresist film pattern 22a and baked photoresist film pattern 13b are used as a mask, as shown in FIG. 7. As a result, a first-thin film pattern 11a is formed. After the completion of this etching step, the semiconductor substrate 10 is selectively exposed.

During the step of etching the first thin film 11, the second photoresist film pattern 22a are almost removed by the plasma gas used at the etching step. As a result, the second photoresist film pattern 22a is left in the form of a residual photoresist film 22b.

Figure 8:
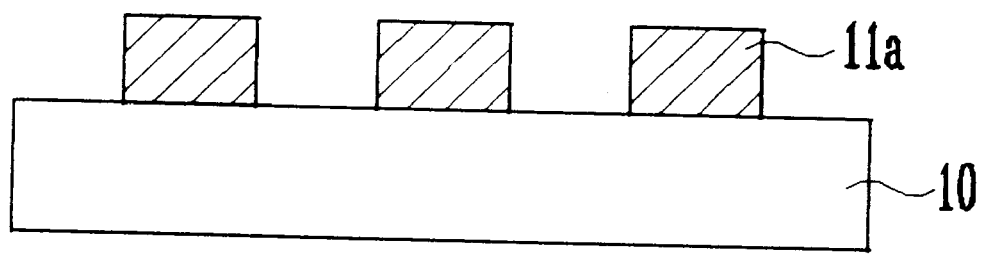

Thereafter, the second thin film pattern 12a, PE-oxide film pattern 21a and residual photoresist film 22b all disposed over the first thin film pattern 11a are completely removed in accordance with a dry etch process using $O_2$ plasma gas, as shown FIG. 8. As a result, only the first-thin film pattern 11a is left on the semiconductor substrate 10. Thus, a micro pattern is obtained. Instead of the dry etch process, a wet etch process using a diluted nitric acid or sulfonic acid solution may be used.

As is apparent from the above description, the method of forming micro patterns in accordance with the present invention provides various effects.

That is, the method of the present invention uses two light exposure masks which have different line patterns respectively corresponding to two or more groups of line pattern portions selected from a micro pattern in an interlaced manner. Accordingly, it is possible to prevent a light diffraction phenomenon from occurring upon carrying out a light exposure process. Therefore, the photoresist film(or any photosensitive material) can be accurately defined into a pattern region and a non-pattern region.

Since a micro pattern is formed using two light exposure masks in accordance with the present invention, it is also possible to obtain a light resolution corresponding to at least two times that obtained in the case using a single light exposure mask. An increased process margin is also obtained. By virtue of the increased light resolution and process margin, micro patterns can be accurately formed by use of conventional steppers. Moreover, semiconductor devices of an integration degree higher than the limit (for example, 1 Giga) can be fabricated.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a micro pattern of a semiconductor device, the method comprising:

providing a semiconductor substrate;

forming a lower layer on the substrate;

forming a first photoresist film on the lower layer;

selectively exposing the first photoresist film to light using a first light exposure mask that includes a first transparent substrate and a first light shield film pattern;

developing and etching a portion of the first photoresist film exposed by the light to form a first photoresist film pattern;

heating the first photoresist film pattern;

forming an intermediate layer on exposed portions of the lower layer and the first photoresist film pattern after the heating step, wherein the intermediate layer includes a plasma-enhanced oxide film, WSi film or TiN film, to stably keep a subsequently-formed second photoresist film without involving a variation in pattern width upon etching the lower layer;

forming the second photoresist film on the intermediate layer;

selectively exposing the second photoresist film to light using a second light exposure mask that includes a second transparent substrate and a second light shield film pattern;

developing and etching a portion of the second photoresist film exposed by the light to form a second photoresist film pattern having pattern portions that are each disposed between adjacent pattern portions of the first photoresist film pattern so that the respective pattern portions of the first and second photoresist film patterns are interlaced;

selectively removing exposed portions of the intermediate layer using the second photoresist film pattern as a mask;

selectively removing the lower layer using the first and second photoresist film patterns as a mask to form a lower layer pattern; and removing the first and second photoresist film patterns and the intermediate layer pattern left on the lower layer pattern.

2. The method of claim 1, wherein the intermediate layer has a thickness of 100 Å to 1,500 Å.

3. The method of claim 1, wherein:

both the intermediate layer and the lower layer are selectively etched in accordance with a dry etch process using a plasma gas.

4. The method of claim 1, wherein:

the removal of the first and second photoresist film patterns and the intermediate layer pattern is carried out by a dry etch process using $O_2$ plasma gas.

5. A method for forming a micro pattern of a semiconductor device, the method comprising:

providing a semiconductor substrate;

sequentially forming a lower layer, a first intermediate layer and a first photoresist film on the substrate;

selectively exposing the first photoresist film to light using a first light exposure mask that includes a first transparent substrate and a first light shield film pattern;

developing and etching a portion of the first photoresist film exposed by the light to form a first photoresist film pattern;

heating the first photoresist film pattern;

forming a second intermediate layer on exposed portions of the first photoresist film pattern after the heating step, wherein the second intermediate layer includes a plasma-enhanced oxide film, WSi film or TiN film, to stably keep a subsequently-formed second photoresist film without involving a variation in pattern width upon etching the first intermediate layer and the lower layer;

forming the second photoresist film on the second intermediate layer;

selectively exposing the second photoresist film to light using a second light exposure mask that includes a second transparent substrate and a second light shield film pattern;

developing and etching a portion of the second photoresist film exposed by the light to form a second photoresist film pattern having pattern portions that are each disposed between adjacent pattern portions of the first photoresist film pattern, so that the respective pattern portions of the first and second photoresist film patterns are interlaced;

selectively removing exposed portions of the second intermediate layer using the second photoresist film pattern as a mask;

selectively removing the first intermediate layer and the lower layer using the first and second photoresist film patterns as a mask to form a first intermediate layer pattern and a lower layer pattern; and completely removing the first and second photoresist patterns and the second and first intermediate layer patterns left on the lower layer pattern.

6. The method of claim 5, wherein:

the removal of the the first and second photoresist patterns and the second and first intermediate layer patterns is carried out in accordance with a dry etch process using a plasma gas.

* * * * *